(12) United States Patent
Matsunaga et al.

(10) Patent No.: US 9,006,654 B2
(45) Date of Patent: Apr. 14, 2015

(54) CHARGED PARTICLE BEAM APPARATUS

(71) Applicant: Hitachi High-Technologies Corporation, Minato-ku, Tokyo (JP)

(72) Inventors: Soichiro Matsunaga, Tokyo (JP); Souichi Katagiri, Tokyo (JP); Hajime Kawano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/447,589

(22) Filed: Jul. 30, 2014

(65) Prior Publication Data
US 2015/0034835 A1 Feb. 5, 2015

(30) Foreign Application Priority Data
Jul. 31, 2013 (JP) .................................. 2013-158900

(51) Int. Cl.
| | |
|---|---|
| *H01J 37/26* | (2006.01) |
| *H01J 37/28* | (2006.01) |
| *H01J 37/304* | (2006.01) |
| *H01J 37/09* | (2006.01) |
| *H01J 37/147* | (2006.01) |

(52) U.S. Cl.
CPC ............. *H01J 37/28* (2013.01); *H01J 37/3045* (2013.01); *H01J 37/09* (2013.01); *H01J 37/147* (2013.01); *H01J 2237/0455* (2013.01)

(58) Field of Classification Search
USPC ....................... 250/306, 307, 309–311, 491.1, 250/492.1–492.3, 492.22, 492.23
See application file for complete search history.

(56) References Cited

U.S. PATENT DOCUMENTS

| | | | | |
|---|---|---|---|---|
| 5,616,926 | A  * | 4/1997 | Shinada et al. ............. | 250/423 F |
| 6,313,474 | B1 * | 11/2001 | Iwasawa et al. ......... | 250/492.21 |
| 7,541,600 | B2 * | 6/2009 | Neuhauser et al. ........ | 250/491.1 |
| 8,143,603 | B2 * | 3/2012 | Suhara et al. ............... | 250/492.2 |
| 8,497,476 | B2 * | 7/2013 | Hatakeyama et al. ......... | 250/310 |
| 2012/0235036 | A1 * | 9/2012 | Hatakeyama et al. ......... | 250/310 |
| 2014/0014848 | A1 * | 1/2014 | Hatakeyama et al. ......... | 250/393 |

FOREIGN PATENT DOCUMENTS

| | | |
|---|---|---|
| JP | 07-094134 A | 4/1995 |
| JP | 08-222163 A | 8/1996 |

OTHER PUBLICATIONS

Bronsgeest, M.S., et al., "'Collapsing rings' on Schottky electron emitters", Ultramicroscopy, 110, pp. 1243-1254 (2010).

(Continued)

*Primary Examiner* — Bernard E Souw
(74) *Attorney, Agent, or Firm* — Miles & Stockbridge P.C.

(57) ABSTRACT

An embodiment is to provide a technique that continuously applies a certain amount of an electron beam to a sample by selecting a beam applied to the sample from an electron beam emitted from an electron source in a scanning electron microscope. A charged particle apparatus is configured, including: a mechanism that detects the distribution of electric current strength with respect to the emitting direction of an electron beam emitted from an electron source; a functionality that predicts a fluctuation of an electric current applied to a sample by predicting the distribution of the electric current based on the detected result; a functionality that determines a position at which a beam applied to the sample is acquired based on the predicted result; and a mechanism that controls a position at which a probe beam is acquired based on the determined result.

15 Claims, 12 Drawing Sheets

(56) References Cited

OTHER PUBLICATIONS

Orloff, Handbook of Charged Particle Optics, Press, New York (1997), pp. 12-15.

* cited by examiner

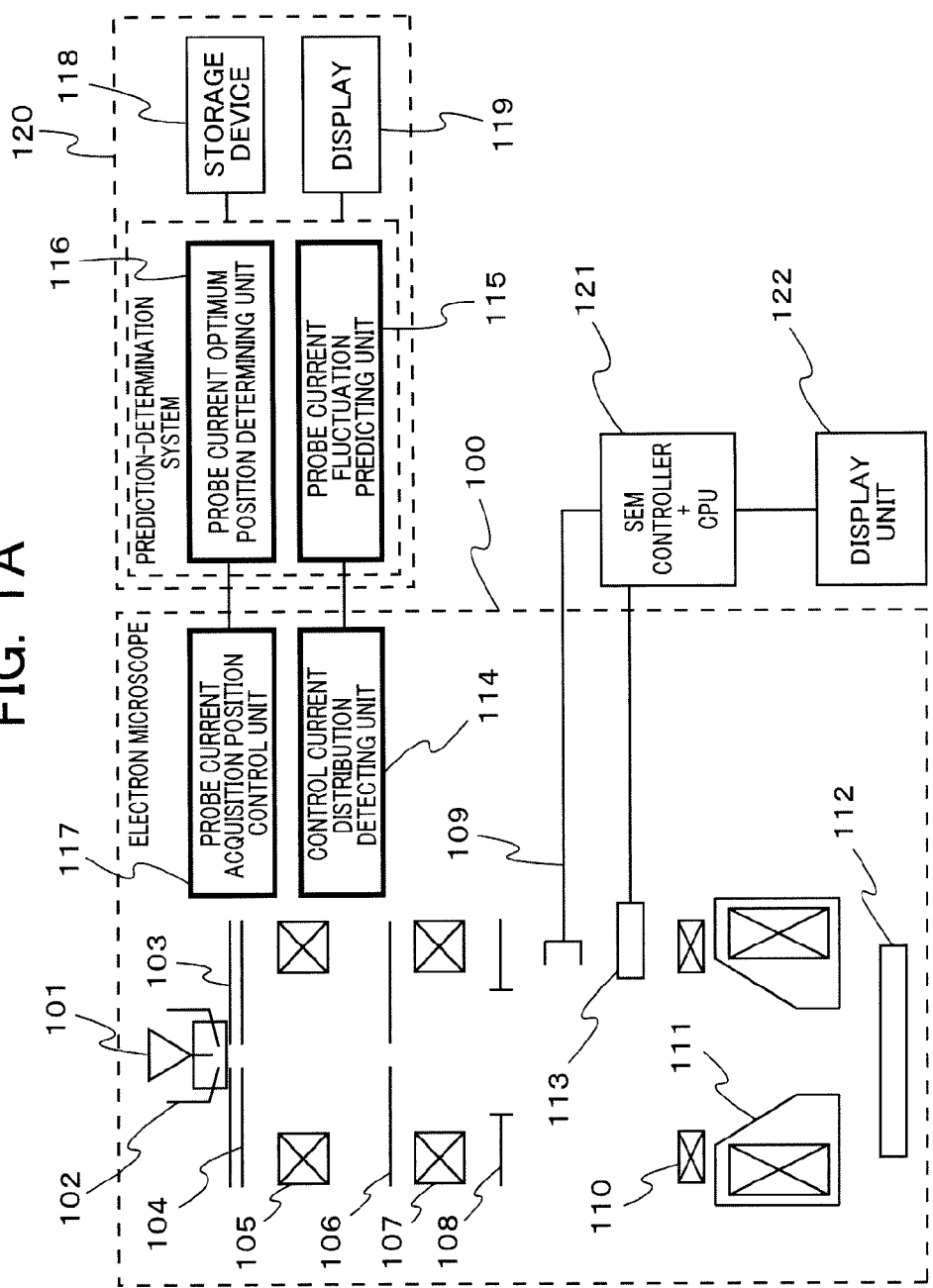

CHARGED PARTICLE BEAM APPARATUS

CLAIM OF PRIORITY

The present application claims priority from Japanese patent application JP2013-158900 filed on Jul. 31, 2013, the content of which is hereby incorporated by reference into this application.

BACKGROUND OF THE INVENTION

The present invention relates to an apparatus that inspects the critical dimensions of fine patterns formed on a sample using a charged particle beam, and more particularly to a charged particle beam application technique for use in an inspection apparatus for semiconductors, for example.

In manufacture of a semiconductor device, for example, since micro circuit patterns are formed in many layers, inspection is performed whether patterns are processed as designed or whether the critical dimensions of patterns are not varied. For this pattern inspection, a scanning electron microscope (SEM) suited to the inspection of the critical dimensions of fine patterns is widely used. In the SEM, an inspection sample is scanned while applying an electron beam to the sample, signal electrons (secondary electrons and back scattered electrons) emitted from the inspection sample are detected, and a scan image (a so-called SEM image) is obtained.

The SEM for use in the critical dimension management of inspection in manufacture is demanded to continuously operate for a long time, and it is necessary to continuously supply electrons applied to a sample in order to continuously operate the apparatus. To this end, a surface diffusion electron source is practically used, in which a single crystal tip is made of a high melting point metal material such as W and Mo and a metal whose work function is lower than the work function of a single crystal tip such as an oxide or a nitride of Zr, Ti, Sc, Hf, or Ba is adsorbed into the surface of the single crystal tip in the order of a monatomic layer. An electric current is carried through a filament to heat such an electron source at a high temperature of 1,500 to 1,900 K, a strong electric field of $5 \times 10^8$ to $1.5 \times 10^9$ V/m is applied, and a stable emission is implemented. Such an electron source is called a Schottky emitter. In the following, in the present specification, the Schottky emitter is noted as an SE tip or simply an electron source.

In a typical electron microscope, the diameter of an electron beam emitted from an electron source is reduced using an aperture formed on a diaphragm, and a part of the beam is applied to a sample. For example, related art literature related to this technique include Japanese Patent Application Laid-Open Publication No. Hei-07-094134, Japanese Patent Application Laid-Open Publication No. Hei-08-222163, M. S. Bronsgeest, P. Kruit, Ultramicroscopy, 110, pp. 1243-1254 (2010), and Orloff, Handbook of Charged Particle Optics, Press, New york (1997).

BRIEF SUMMARY OF THE INVENTION

The resolution or repeatability of an enlarged image obtained through the SEM greatly depends on a primary electron beam applied to a sample, that is, the performance of a probe beam. The performance includes the current density and energy distribution (energy width: $\Delta E$) of electrons included in a beam, for example. Since the amount of an electric current emitted from the sample becomes increased when the probe current density of the probe beam is great, a high signal-to-noise ratio can be achieved for a short time, and an SEM image of excellent image quality can be obtained for a short time. Moreover, since an electron beam can be converged on a narrower region when $\Delta E$ is small, the resolution of an SEM image is improved.

In these years, it is revealed that the current density and $\Delta E$ of an electric current emitted from the electron source have distributions in a beam and in some cases, the distributions become uneven (see M. S. Bronsgeest, P. Kruit, Ultramicroscopy, 110, pp. 1243-1254 (2010)), and Orloff, Handbook of Charged Particle Optics, Press, New York (1997)). Here, since a tiny part of a beam applied from the electron source is used as a probe beam, a problem arises in that the resolution of the obtained SEM image is varied depending on which portion of the emitted beam is applied to the sample as a probe beam, causing the degradation of the repeatability of the image quality of the SEM image and inspection values using the SEM image. Moreover, it is reported that the uneven distribution is varied with time (see M. S. Bronsgeest, P. Kruit, Ultramicroscopy, 110, pp. 1243-1254 (2010), and Orloff, Handbook of Charged Particle Optics, Press, New York (1997)).

Presently, in many electron microscopes, the amount of an electric current passed through the final diaphragm and applied to the sample is measured, or the absolute quantity of an electric current blocked by the diaphragm is measured, and then a place considered to be the optimum probe beam is selected, or the current density is adjusted. However, this method has a problem in that it is not enabled to search the optimum place as a probe current in the case where the current density in a beam is uneven and the spatial distribution is temporally varied.

As an example of the situation that the current density in a beam becomes uneven and the spatial distribution is varied, a phenomenon (in the following, referred to as a dark ring phenomenon) is known in which an annular region having a small current density is taken place in an emitted beam (in the following, referred to as a dark ring) and the position of the region having a small current density moves with time as described in Japanese Patent Application Laid-Open Publication No. Hei-07-094134, Japanese Patent Application Laid-Open Publication No. Hei-08-222163, M. S. Bronsgeest, P. Kruit, Ultramicroscopy, 110, pp. 1243-1254 (2010), and Orloff, Handbook of Charged Particle Optics, Press, New york (1997). There is a problem in that when the dark ring phenomenon is taken place, the distribution of the current density becomes uneven, and it is not enabled to find a dark ring until a dark ring portion having a small amount of an electric current is involved in a probe beam, in the conventional method for measuring an amount of a probe current or an amount of an electric current blocked by a diaphragm.

In the following, the dark ring phenomenon will be described in detail. The dark ring phenomenon is involved in the production of a step in the order of a few nanometers on an emission surface having a diameter of about 0.1 to 2 µm at the tip end of an electron source, which is reported in M. S. Bronsgeest, P. Kruit, Ultramicroscopy, 110, pp. 1243-1254 (2010), and Orloff, Handbook of Charged Particle Optics, Press, New york (1997). Since the step at the tip end of the electron source moves while reducing the radius with the lapse of time, the position and radius of the dark ring are changed with time. Because of this, when the dark ring is overlapped with the aperture of a diaphragm through which a probe current is acquired, the amount of the probe current is greatly reduced. However, in the conventional method, since the occurrence of the dark ring is not detected until the probe current is reduced, it is not enabled to avoid a problem in that it is not enabled to detect the timing at which the probe current is reduced beforehand and the properties of the electron beam, that is, the image quality of the SEM image is abruptly varied. The dark ring is finally dissipated by reducing the radius, and the state is returned to the original state of no dark ring.

However, after the lapse of a certain time period, a dark ring is again taken place to repeat the phenomenon. On this account, a problem arises in that a periodic electric current fluctuation is caused and the image quality of an SEM image is unstable. In order to eliminate the dark ring, Japanese Patent Application Laid-Open Publication No. Hei-07-094134 discloses a scheme of applying heat at a temperature of 2,150 K, and Japanese Patent Application Laid-Open Publication No. Hei-08-222163 discloses a scheme in which heating is applied at a temperature of about 1,900 K and an electric field about twice a general electric field is temporarily applied. However, it is necessary to take 30 minutes or more for again emitting a beam after manipulation to eliminate the dark ring, and the apparatus has to halt during this time period. Moreover, in these processes, the elimination process is not performed based on the detected result of the dark ring, and the dark ring phenomenon is avoided by manipulation to eliminate the dark ring on a regular basis. In the inspection of semiconductor manufacture lines on the premise of continuous operations, the stop of the manufacture lines caused by the halt of the apparatus causes the degradation of production efficiency.

It is an object of the present invention to provide a charged particle beam apparatus that can predict the variation of a probe beam to maintain the quantity of a charged particle beam or ΔE of the probe beam at constant and obtain an image of high image quality.

In order to achieve the object, an aspect of the present invention is to provide a charged particle beam apparatus including: a distribution detecting unit configured to measure a distribution of an amount of an electric current with respect to an emitting direction of a charged particle beam emitted from a charged particle beam emitter; a fluctuation predicting unit configured to predict a fluctuation of an electric current applied to a sample from a distribution of an electric current of the charged particle beam measured by the distribution detecting unit; a position determining unit configured to determine a position of the electric current applied to the sample based on a predicted result of the fluctuation predicting unit; and a position control unit configured to control a position at which the charged particle beam applied to the sample is acquired based on a determination made by the position determining unit.

According to an aspect of the present invention, the properties of a probe current of a charged particle beam, that is, the image quality of a charged particle beam image can be maintained at constant without stopping the apparatus, so that it is possible to continuously perform inspection of excellent repeatability, and it is possible to improve the quality and velocity of inspection.

Moreover, the optimum portion of a beam can be acquired as a probe beam from a beam emitted from a charged particle beam emitter, so that it is possible to suppress a variation of the inspection performance for individual apparatuses as compared with a previously existing technique, and it is possible to achieve highly accurate inspection.

BRIEF DESCRIPTION OF THE DRAWINGS

FIG. 1A is a diagram of an exemplary configuration of essential parts of an overall electron microscope according to a first embodiment;

DETAILED DESCRIPTION OF THE INVENTION

Figure 1B:
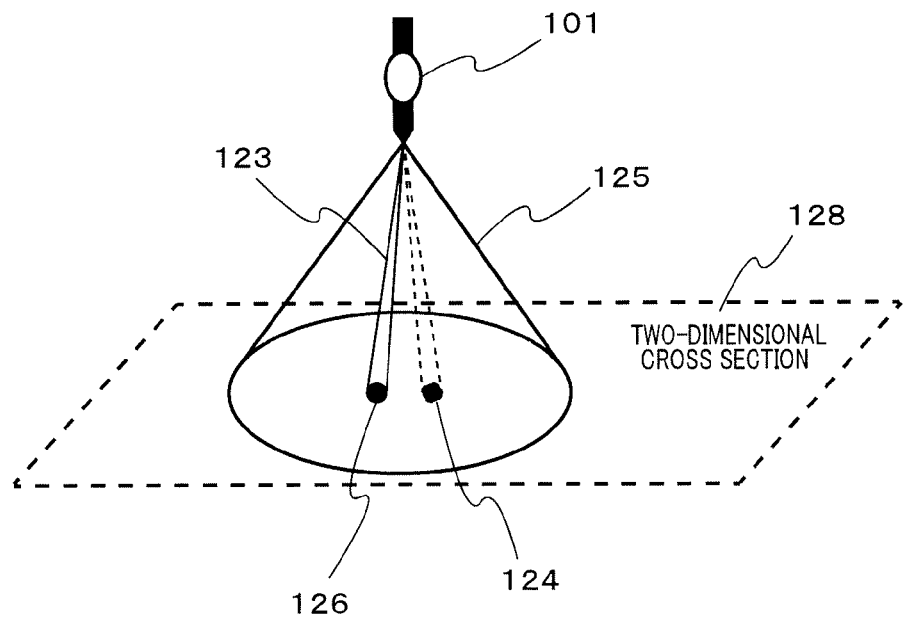
FIG. 1B is a diagram of an electron beam applied from an electron source of the electron microscope according to the first embodiment.

In the following, embodiments will be described mainly on an apparatus using an electron beam emitter for a charged particle beam emitter. However, the present invention is applicable to electron beam application apparatuses as well as other apparatuses using an ion beam, for example. First, the outline of a preferred form will be described in the case where an electron beam is used as a charged particle beam.

For example, the apparatus is a charged particle apparatus in a configuration including: a control current distribution detecting unit for a mechanism that measures the distribution of the amount of an electric current with respect to the emitting direction of an electron beam emitted from a Schottky emitter; a probe current fluctuation predicting unit for a mechanism that predicts the variation of a probe beam from the distribution of the amount of the electric current of the measured beam; a probe current optimum position determining unit for a mechanism that determines the position at which a probe beam is acquired based on the predicted result; and a probe current acquisition position control unit for a mechanism that controls the apparatus so as to select a position at which a probe beam is acquired based on the determined result.

For the mechanism that measures the distribution of an electric current, it may be fine that a mechanism is newly inserted which measures the distribution of the electric current of a beam emitted from the electron source or that a diaphragm is subjected to micro-fabrication. In the case where it is desired to achieve a high resolution, it is fine to perform the former in order to prevent the deformation of the diaphragm due to processing the diaphragm. On the other hand, when a new mechanism is introduced, the number of components in the apparatus is increased and it takes time for vacuuming. In the case where it is desired to prevent this problem and achieve a high apparatus operation rate, it is fine to perform the later in which the diaphragm itself is processed to measure a distribution.

Moreover, in order to control the position at which a probe beam is acquired, it is fine to deflect a beam emitted from the electron source. However, in the case where it is necessary to have a high throughput, it is fine to use electrostatic deflection using an electrode having the characteristics that can provide a faster deflection. On the other hand, in the case where importance is placed on image quality and it is desired to reduce image noise, it is fine to use electromagnetic deflection using a coil having the characteristics that are resistant to earth noise. Moreover, in the case where it is desired to operate the apparatus for a long time continuously, deflection is performed in two steps or more to adjust the position at which a beam is acquired in order not to change the physical position of the electron source or the diaphragm.

Furthermore, for the position at which deflection is performed, deflection is generally performed at a position closer to the electron source, that is, deflection is performed immediately after extracting electrons, for example. In the case where there is no space in which an electrode or a coil for deflection is disposed immediately after extracting electrons, deflection is performed at a position in a wider space, that is, deflection is performed previous or subsequent to a condenser lens or immediately previous to the final diaphragm, for example. In the following, various embodiments of the present invention will be described with reference to the drawings.

First Embodiment

The embodiment is an embodiment using an electron microscope in the most basic configuration. In FIG. 1A, an electron beam is produced in an electron source 101 of an electron microscope 100. The electron beam is extracted by an extracting electrode 103, and accelerated by an accelerating electrode 104. It is noted that thermoelectrons produced from a W filament portion that heats the electron source are blocked by a suppresser electrode 102. After that, the electron beam is condensed at a first condenser lens 105, a diaphragm 106, and a second condenser lens 107, and finally condensed on a sample 112 by an objective lens 111.

As illustrated in FIG. 1B, generally, an entire electron beam 125 emitted from the electron source 101 is blocked by diaphragms disposed on the extracting electrode 103 and the accelerating electrode 104 and the diaphragm 106, and a tiny part of the entire electron beam 125 is a beam (a probe beam) 123 applied to a beam application position 126 on a two-dimensional cross section 128 schematically illustrated. The probe beam 123 is applied to the sample, and electrons secondarily produced from the sample are detected by a detector 113. Here, the beam applied to the sample is scanned at another beam application position 124, for example, using a scanning coil 110, and secondary electrons produced from the sample are in turn detected by the detector 113.

The signals of the secondary electrons are then processed by a control processing unit 121 formed of an SEM controller, a central processing unit (a CPU) for data processing, or the like, and a two-dimensional image is formed. This image is drawn as an SEM image on a display unit 122. It is noted that the electron beam after passed through the diaphragm 106 is introduced into a Faraday cup 109 using a blanker 108, so that the amount of an electric current applied to the sample can be measured.

FIG. 1A is an overall structural diagram of a control mechanism block necessary for the configuration according to the embodiment. A control mechanism according to the embodiment is configured by combining four mechanisms including a control current distribution detecting unit 114 that is a distribution detecting unit, a probe current fluctuation predicting unit 115 that is a fluctuation predicting unit, a probe current optimum position determining unit 116 that is a position determining unit, and a probe current acquisition position control unit 117 that is a position control unit. It is noted that in the present specification, the combination of the probe current fluctuation predicting unit 115 and the probe current optimum position determining unit 116 is referred to as a prediction-determination system for convenience. It is possible that the result of the prediction-determination system combining the probe current fluctuation predicting unit 115 and the probe current optimum position determining unit 116 is stored on a storage device 118 and the result is displayed using a display 119. Moreover, the storage device 118, the display 119, and the prediction-determination system are sometimes together referred to as a control system 120. It is noted that it is possible that the control system 120, the control processing unit 121, and the display unit 122, for example, are combined and configured of a personal computer (PC) or a computer system such as a server, not limited to the configuration according to the embodiment illustrated in FIG. 1A.

Figure 2:
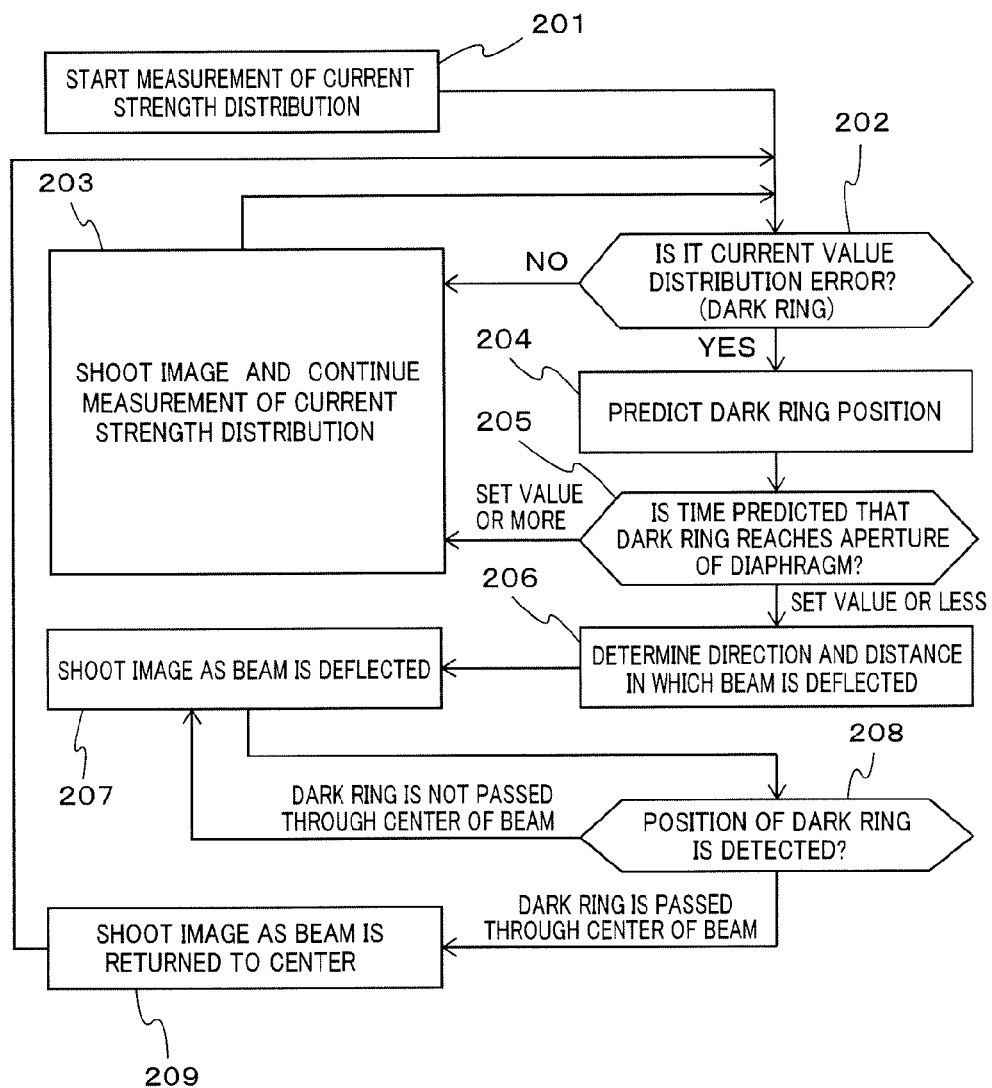
FIG. 2 is a flowchart for operating the electron microscope according to the first embodiment.

Subsequently, FIG. 2 is a flowchart of an exemplary operation of the configuration according to the embodiment. First, the control current distribution detecting unit 114 disposed in the stage previous to the diaphragm 106 is used to start the measurement of the distribution of electric current strength with respect to the emitting direction of an electron beam emitted from the electron source (201). Based on the measured data, the presence or absence of an error of the distribution of electric current values (a dark ring) is determined (202). In the case where there is no error of the distribution of electric current strength (No), a probe beam is acquired from the center of the beam to start imaging (203).

In the embodiment, since the distribution of electric current strength can be measured simultaneously when an SEM image is acquired, it is unnecessary to stop the measurement until the apparatus is stopped entirely. However, the distribution of electric current strength may be acquired at the timing of loading the sample into the apparatus, before acquiring an SEM image, or on a regular basis. The presence or absence of the occurrence of a dark ring is determined using the distribution of electric current strength. In the embodiment, the timing of determination is the same as the timing of loading the sample into the apparatus. However, the determination may be performed before acquiring an SEM image or on a regular basis with intervals of certain time periods. In the case where an error of the distribution of the electric current is taken place, that is, a dark ring is taken place, which is described in the summary, the position of the dark ring is predicted using the probe current fluctuation predicting unit 115 (204), and then the arrival time of the dark ring at the aperture of the diaphragm is predicted (205).

Imaging and monitoring are continued when the predicted time is a set value or more (203). When the predicted time is the set value or less, the direction and the distance in which the beam is deflected are determined (206), and the beam is deflected for imaging, that is, the position at which a probe beam is acquired is changed to avoid a dark ring (207). At this time, the position at which a probe beam is acquired is determined by the probe current optimum position determining unit 116, and the position at which a probe beam is actually acquired is controlled using the probe current acquisition position control unit 117 based on the determined result. After controlling the position, the distribution of the electric current is continuously measured and the position of the dark ring is detected (208). When the position of the dark ring is not passed through the center of the beam, imaging is continued as the beam is kept deflected (207). When the dark ring is passed through the center of the beam, the deflection is released, the beam is returned to the center for imaging (209), and the measurement of the distribution of the electric current is continued.

Figure 3:
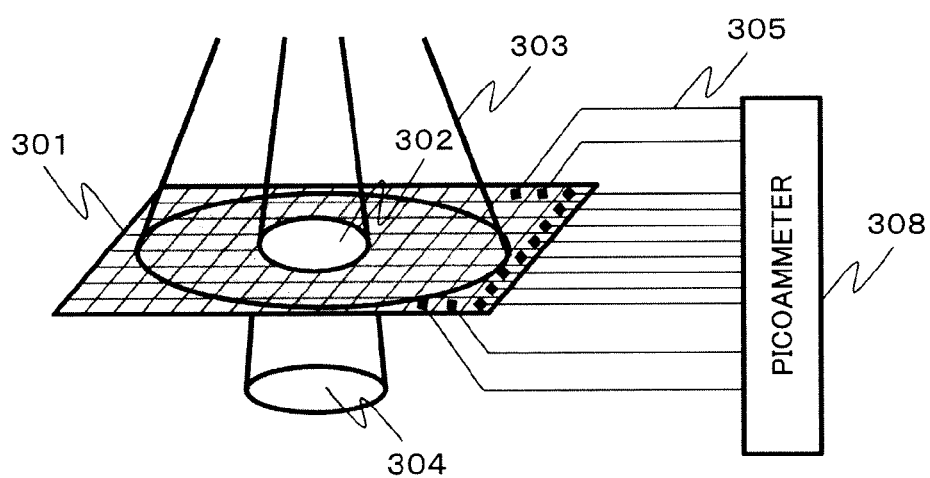
FIG. 3 is a diagram of a method for measuring the distribution of electric current strength of the electron microscope according to the first embodiment.

It is noted that as an example is illustrated in FIG. 3, for a mechanism that measures the distribution of the electric current of a beam 303 emitted from the tip with respect to the emitting direction, a through hole 302 is provided, a diaphragm 301 that blocks the beam is processed to have electrodes in a tile shape, and a picoammeter 306 detects the amount of an electric current applied to the individual tile-shaped electrodes through wires 305. The electrodes divided in a two-dimensional tile shape are connected to the picoammeter 306 through the wires 305, and mapping data I (x, y) of electric current strength is acquired in the array (x, y) of the tile-shaped electrodes. Since the mapping result of the electric current strength is changed in association with the movement of a dark ring, it is possible to predict the position of the dark ring after a certain time period from the time variation of the two-dimensional electric current mapping data. It is noted that in FIG. 3, 304 schematically expresses a beam passed through the through hole 302 of the diaphragm 301.

Figure 4A:
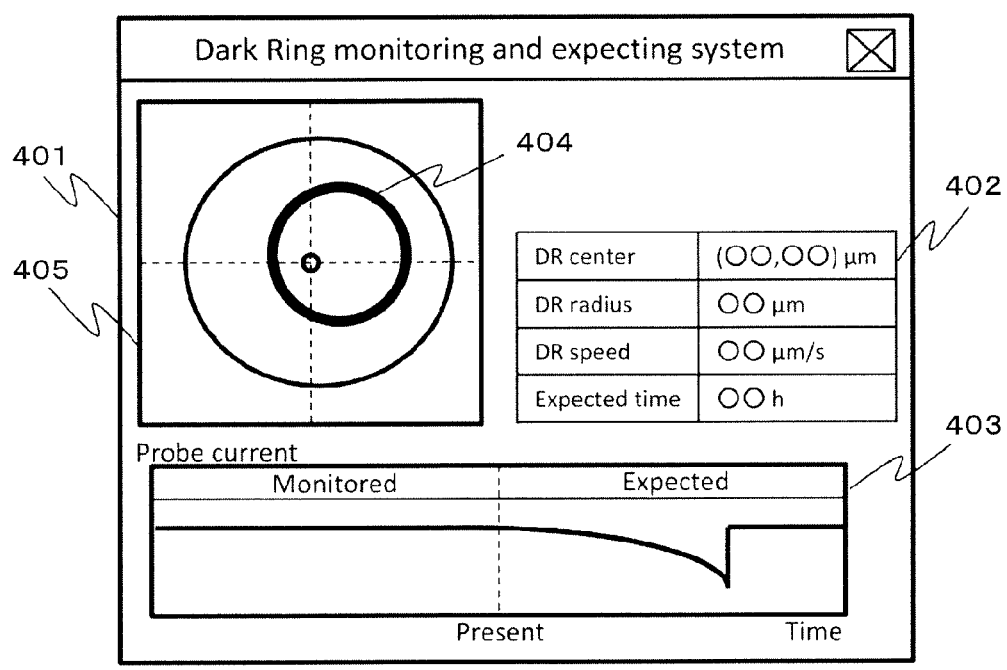
FIG. 4A is a diagram of an exemplary display of the result of analysis and prediction of the distribution of an electric current according to the first embodiment.
Figure 4B:
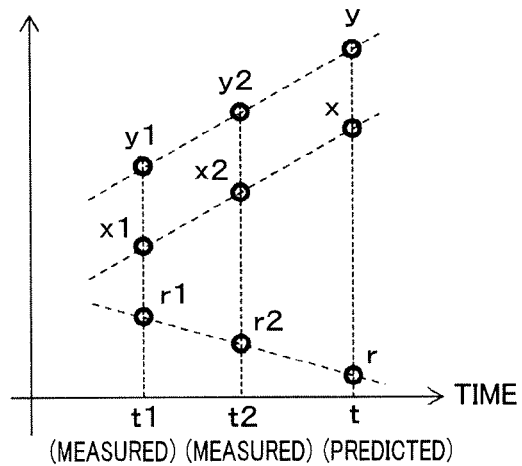
FIG. 4B is a graph of the result of analysis and prediction of the distribution of an electric current according to the first embodiment.

Next, a method for predicting the position of the dark ring and examples of output as a result in the configuration according to the embodiment will be described with reference to FIGS. 4A and 4E. As illustrated in FIG. 4B, when the radius of a dark ring measured at time t1 is defined as r1, the position is defined as (x1, y1), the radius of the dark ring measured at time t2 is defined as r2, and the position is defined as (x2, y2), the following was predicted that these values are predicted to change linearly with respect to time, and the radius r and the position at time t were predicted:

radius $r = ((r2-r1)/(t2-t1)) \times (t-t2) + r2$ position $(x,y) = (((x2-x1)/(t2-t1)) \times (t-t2) + x2, ((y2-y1)/(t2-t1)) \times (t-t2) + y2)$ It is noted that in the embodiment, it is predicted that the values are changed linearly. However, it may be fine that the number of measurement points by mapping is increased and the values are predicted by a multidimensional function, an exponential function, a logarithmic functions, and the linear combination of these functions. Time was predicted at which the fluctuation of the amount of the probe current is taken place by finding time at which the predicted position of the dark ring is laid on the aperture of the diaphragm. Here, a device that stores the time variation of two-dimensional data preferably includes an electronic medium such as a hard disk drive (HDD) and a solid state drive (SSD). Moreover, as described above, it is also possible that the display 119 or a device having a display functionality is used to visually represent two-dimensional data and the analyzed result.

In the embodiment, an electronic display was used for a device to provide the display functionality, and display was continuously shown. Here, FIG. 4A is an example of display. A display region 401 shows two-dimensional data 405, a section 402 for the position, the velocity, predicted arrival time of the dark ring, a section 403 for the probe current monitored result to the present time and an expected transition, and so on. In the two-dimensional data 405, a dark ring 404 is displayed. Moreover, the strength profile of the dark ring may be displayed instead of the two-dimensional data 405. Furthermore, data may be printed at intervals of certain time periods. In addition, it may be fine that alarm is made when an error of the beam distribution is detected and two-dimensional data or an analyzed result may be output in alarm. The alarm includes an indication on the display, the generation of an alarm sound, lighting an alarm lamp, or the like.

Based on the predicted result, a position at which a probe current is acquired was determined. In the following, a determination method is shown. As a two-dimensional mapping result of electric current values, in the case where the distribution of the electric current is uniform and no dark ring is taken place, the center of the beam was used for a probe beam. The center of the beam was determined in which a point that takes 10% of the maximum electric current value in two-dimensional mapping is extracted as the contour of the beam and an x-coordinate mean value and a y-coordinate mean value are defined as the center coordinates.

In the embodiment, the mean value of the extracted coordinates was used. However, the average of the coordinates of the maximum value and the minimum value may be used. It was assumed that a dark ring is taken place in the case where the minimum value having 70% of the maximum value or less is taken place in the distribution of the electric current and the position is varied with the lapse of time. Moreover, in the embodiment, the value 70% was used. However, the value ranging from 30 to 90% may be used. In the case where the dark ring is taken place, the subsequent processes were determined whether the minimum value of a distance d between a dark ring 127 and the diaphragm (distance $d=(x^2-y^2)0.5$) exceeds a distance D calculated from a preset value for the dark ring arrival time.

Figure 5:
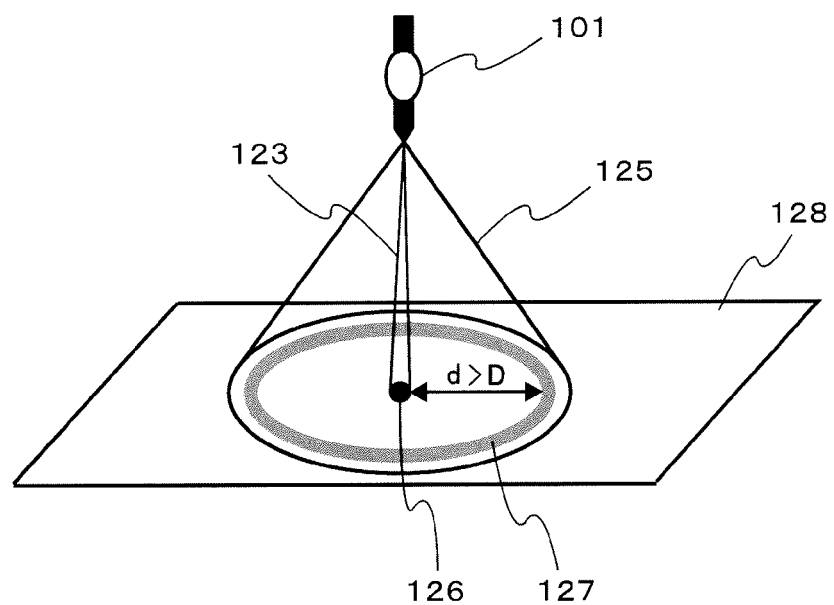
FIG. 5 is a schematic diagram of the distribution of an electric current according to the first embodiment when a dark ring is taken place.
Figure 6A:
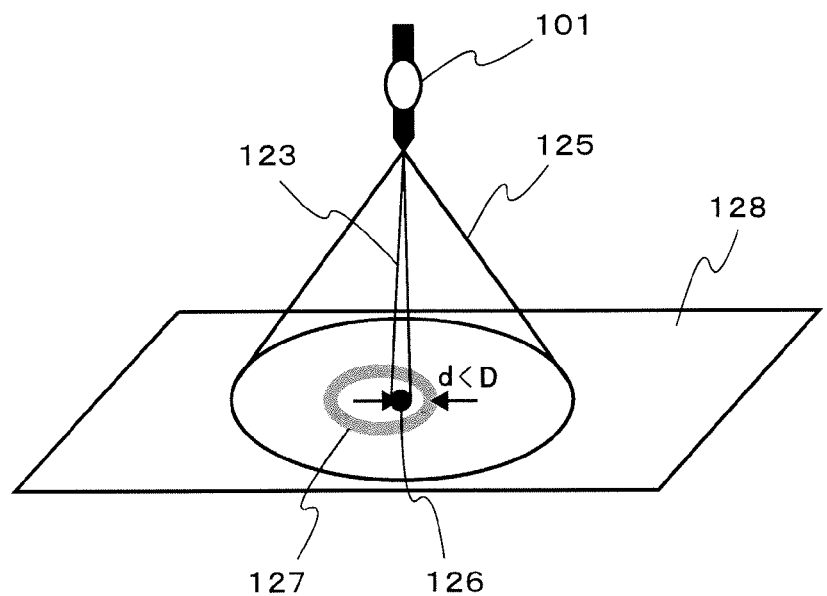
FIG. 6A is a schematic diagram that a dark ring reaches a diaphragm to acquire a probe beam and the dark ring is avoided by deflecting a beam.
Figure 6B:
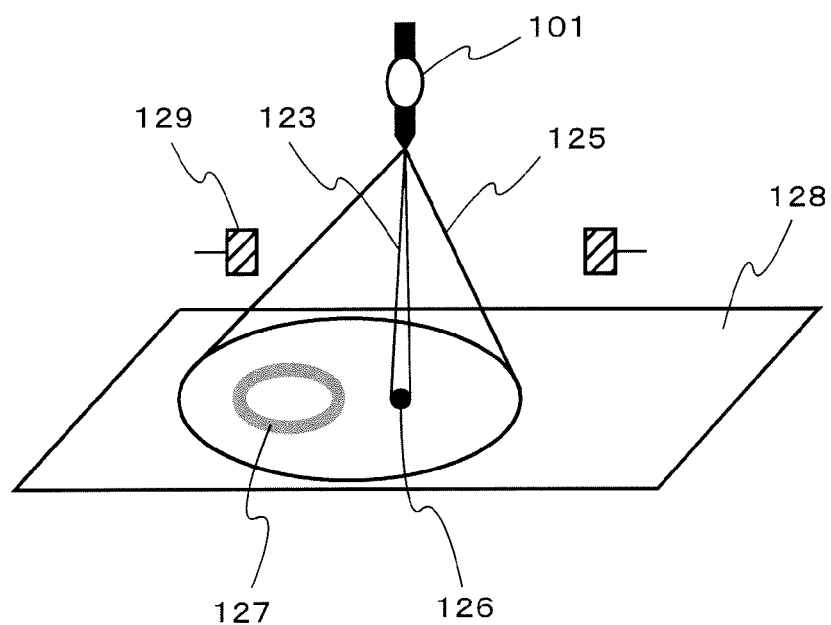
FIG. 6B is a schematic diagram that a dark ring reaches a diaphragm to acquire a probe beam and the dark ring is avoided by deflecting a beam.

As illustrated in FIG. 5, when the distance d between the dark ring 127 and the diaphragm is d>D, a probe beam is acquired from the center of the beam and imaging is continued. On the other hand, as illustrated in FIG. 6A, when the distance d is d<D, the position at which the probe beam 123 is acquired by a deflector 129 is moved to the outside of the dark ring as illustrated in FIG. 6B.

Figure 7:
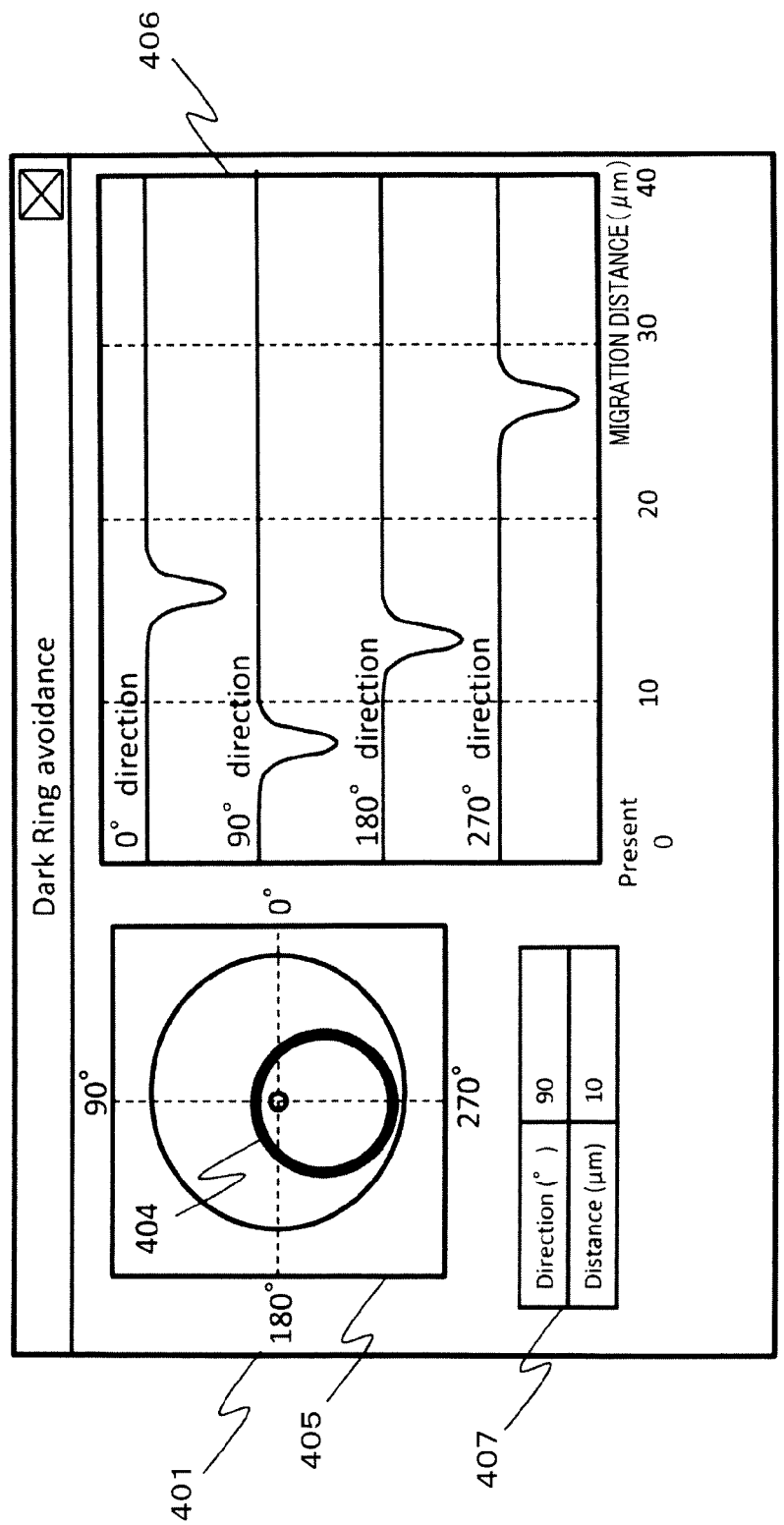
FIG. 7 is a schematic diagram of an exemplary method for determining in the direction and the distance to avoid a dark ring and an exemplary display method according to the first embodiment.

FIG. 7 is a method for determining the position at which a probe beam is acquired after moving, in the configuration according to the embodiment. With the use of the two-dimensional electric current distribution data 405 used for prediction, a transition 406 of the electric current strength can be obtained in the case where the distribution is moved from the center of the beam from a certain direction. The two-dimensional electric current distribution data 405 of the region 401 is an electric current strength profile in the directions at angles of 0, 90, 180, and 270 degrees from the center. Based on this result, a direction and a distance were determined in which a dark ring can be avoided with a traveling distance as short as possible. In the case illustrated in FIG. 7, it was determined that it is fine to move the distribution in the 90-degree direction closer to the center of the beam as much as possible by a distance in which the electric current fluctuation exceeds the dark ring and falls within a reduction of 10% of the electric current value of the center of the beam, here, 10 μm. The determined result can also be displayed on the display as expressed by a section 407. It is noted that in order to determine the moving direction for improving accuracy, the number of directions to acquire current density transitions may be increased. Moreover, in the embodiment, the determination whether a dark ring is passed is a distance in which the electric current value falls within 10% of the electric value. However, the value may be set to a value ranging from 0 to 20%.

In the embodiment, the position at which a probe current is acquired was controlled based on this determined result. For the control method, the electron beam emitted from the electron source was deflected. The direction to deflect is determined so as to move the distribution to the position of the determined result, and an angle θ for deflection is determined from the position of the determined result. It is fine that when it is assumed that the distance for deflection is defined as X, the beam is deflected so as to hold the following equation, where the distance is defined as l, which is a distance from the electron source to the position at which the distribution of the electric current is acquired:

$$\tan\theta = x/l$$

However, in the case where electrons are accelerated, or electrons are converged on the lens, it is necessary to consider the influence.

The beam emitted from the electron source is passed through the extracting electrode 103 and the accelerating electrode 104, then passed through the first condenser lens 105, the diaphragm 106, the second condenser lens 107, and the objective lens 111, and applied to the sample. Since a part of the beam is blocked by the electrodes disposed in the stages previous to the diaphragm 106, the beam is preferably deflected at a position near the electron source as much as possible. Here, for a mechanism that deflects the beam, electrostatic deflection using an electrode was used. It is noted that electromagnetic deflection using a coil can also be used.

Figure 8:
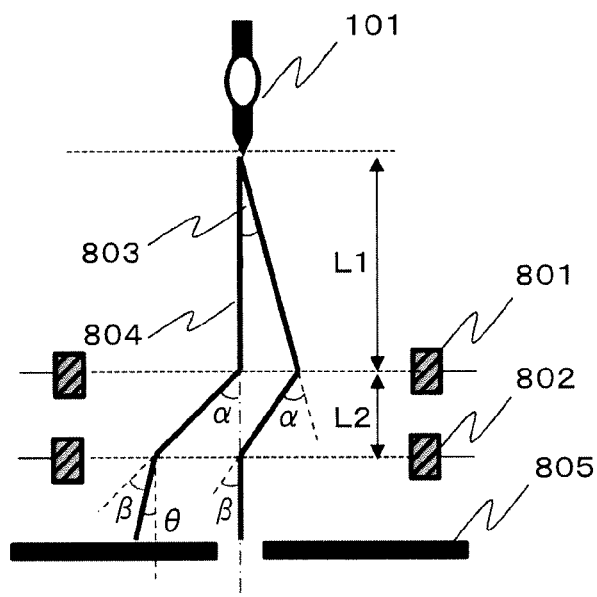
FIG. 8 is a schematic diagram of the relationship between deflection electrodes and the deflection of a beam according to the first embodiment.

FIG. 8 is the relationship between the deflection electrodes and the deflection angle of a beam in the embodiment. In the embodiment, a plane on which beam mapping is performed is defined as an X-Y plane, two pairs of deflection electrodes are used for deflecting the beam in the x-direction and in the y-direction, and these electrodes are used in two stages. First, a first deflection electrode 801 was disposed immediately after the extracting electrode for deflecting a beam. An angle at which the beam is deflected by the electrode 801 is defined as a. After that, the beam was deflected in the reverse direction of the electrode 801 by at an angle β using a second deflection electrode 802. Finally, a beam was tilted at the angle α−β=θ, and a beam 803 emitted from the electron source in the θ-direction was passed through a diaphragm 805 which is the outlet of an electron gun in the state in which the beam 803 was not tilted. Here, when a distance from the electron source to the electrode 801 is defined as L1 and a distance from the electrode 801 to the electrode 802 is defined as L2, the beam 803 is passed through the aperture formed on the diaphragm 805 and emitted from the electron gun by determining the angles α and β so as to find:

$$L1 \tan\theta = L2 \tan\beta$$

that is, $$L1 \tan(\alpha-\beta) = L2 \tan\beta$$

A table in which the relationship among the angles θ, α, and β is found is prepared beforehand, so that a dark ring can be avoided at high speed without stopping the application of the electron beam.

Practically, since the angles α and β are determined depending on voltages applied to the electrodes 801 and 802 and the velocity of electrons when passed through these electrodes, it is fine that the relationship among the angle θ, the voltage applied to the electrode 801, and the voltage applied to the electrode 802 is provided on a table. Here, in the case where there are a large number of accelerating electrodes in the electron gun, there is no problem when the electrode 801 and the electrode 802 are provided across the accelerating electrode. However, since the velocity of the beam is changed due to acceleration, it is fine that a table for the angles α and β' is prepared so as to hold the relationship among the angles θ, α, and β', using the angle β' corrected by acceleration:

$$\theta = \alpha - \beta'$$

With the configuration of the first embodiment described above, it was enabled to prevent the degradation of the resolution and a reduction in the repeatability of inspection caused by a dark ring, which can be prevented only by eliminating a dark ring in association with the halt of the apparatus for 30 minutes or more, with no holt of the apparatus, and the inspection velocity was improved 10% or more.

Second Embodiment

Figure 9:
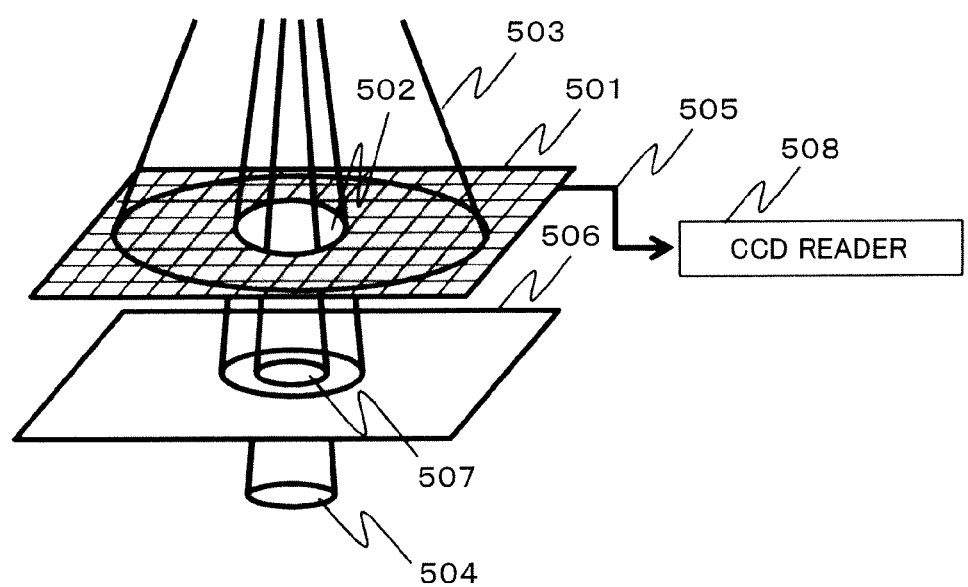
FIG. 9 is a diagram of a method for measuring the distribution of electric current strength according to a second embodiment.

A second embodiment is an embodiment in the configuration in which a mechanism that measures the intensity distribution of the electron beam is newly introduced. As illustrated in FIG. 9, the distribution of an electric current was detected in which a diaphragm 501 is disposed on which an electron detecting device such as a charge coupled device (CCD) is two-dimensionally disposed on a diaphragm 506, or between an electron source and the diaphragm 506, a beam is received on the two-dimensionally disposed CODs on the diaphragm 501, and information from the CCDs is read by a CCD reader 508 through a wire 505. It is noted that an aperture 502 of the CCD diaphragm 501 is greater than an aperture 507 of the diaphragm 506, and a beam passed through the aperture 507 is a probe beam 504. Since the beam passed through the aperture 507 generally has a spread of a few millimeters, it is necessary to dispose a CCD in the size smaller than the spread. Other configurations are the same as the first embodiment except a method for acquiring the two-dimensional data of the distribution of an electric current.

The effect according to the embodiment is the same as the first embodiment. However, the embodiment is advantageous in that it is unnecessary to apply micro-fabrication to the diaphragm and only a device is newly inserted, so that it is unnecessary to change components involved in an electro-optical system that acquires an electric current applied to the sample before the present invention is carried out.

Third Embodiment

A third embodiment is an embodiment in the case where another mechanism that measures the intensity distribution of an electron beam is newly introduced. However, a method according to the embodiment is a method that simply implements measurement at low cost without applying micro-fabrication described in the first embodiment or without using expensive CCDs described in the second embodiment.

Figure 10:
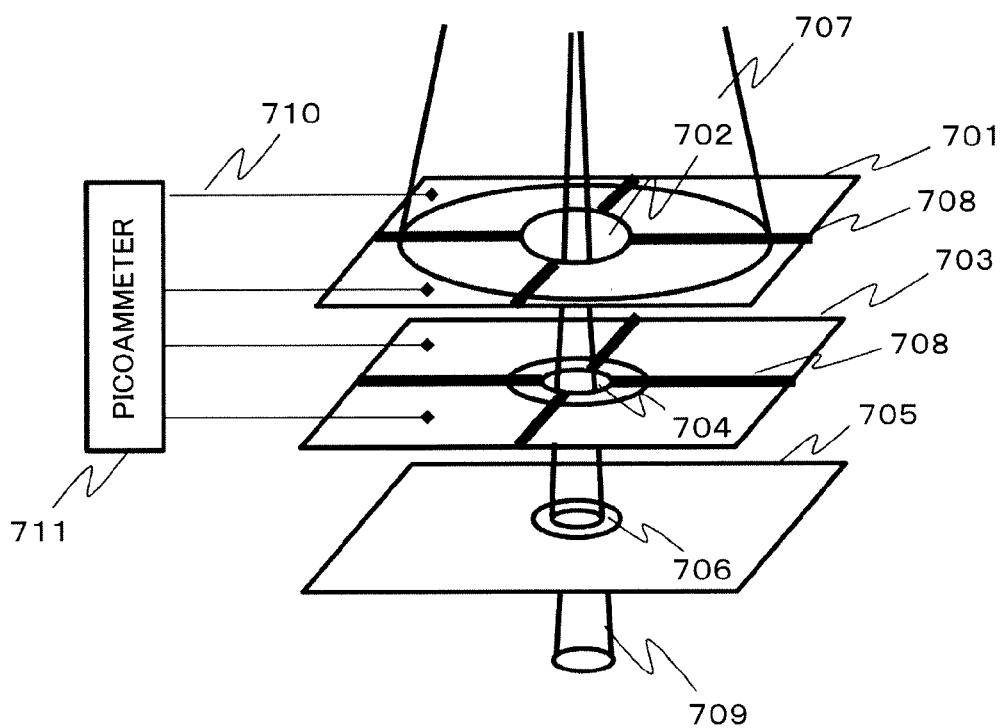
FIG. 10 is a diagram of a method for measuring the distribution of electric current strength according to a third embodiment.

As illustrated in FIG. 10, for a mechanism that measures the intensity distribution of the electron beam, a dual diaphragm divided into four quadrants or eight quadrants was disposed. FIG. 10 is the case where the diaphragms are divided into four quadrants. The diaphragms 701 and 703 include apertures 702 and 704, respectively, different in size.

The aperture 704 is smaller than the aperture 702. The distribution of the electric current in four quadrants was acquired by reading the amount of an electric current colliding against the individual diaphragms using a picoammeter 711 through wires 710. Moreover, the dual diaphragm is disposed, so that the distribution of the electric current can be acquired in a region closer to the aperture of the diaphragm. Although this embodiment does not directly map the distribution of an electric current, the embodiment sufficiently determines the direction and the position to avoid a dark ring.

The determination method is shown. When a dark ring is brought close to the diaphragm, passed through the aperture 702, and then blocked by the aperture 703, the amount of an electric current blocked by the diaphragm 701 is increased, whereas the electric current blocked by the diaphragm 703 is reduced. Therefore, the direction in which this phenomenon is first taken place on the divided diaphragm is the direction closest to the dark ring. The moving direction of the beam was determined based on the theory. Moreover, the dark ring at this time is located at the rim of the aperture 702 of the diaphragm 701. Therefore, a distance to the dark ring was determined based on the sizes of the apertures of the diaphragms.

In the embodiment, vacuum is the best for an insulator 708 when dividing the diaphragms 701 and 703. Although an insulator is also a candidate for the divided member, the direct use of an insulator on the portion at which the electron beam is directly applied causes static electrification by the insulator, and it is likely to distort the track of the electron beam. However, the electrons are blocked by the diaphragm 701, so that an insulator such as a metal oxide can be used for the insulation between the diaphragm 701 and the diaphragm 703 or between the diaphragm 703 and the diaphragm 705. Moreover, an insulator such as an oxide can be used for a portion at which the beam is not directly applied, including the outer circumferential portions of the diaphragms 701, 703, and 705, or a part of the insulator 708 behind the diaphragms. In the embodiment, the determination of the moving direction is restricted by the split number of the diaphragm, and the determination of the traveling distance is restricted by the size of the aperture 702. However, the other configurations are the same as the first embodiment other than the process after acquiring the two-dimensional data of the distribution of an electric current.

The effect according to the embodiment is the same as the first embodiment. However, the embodiment is advantageous in that micro-fabrication is unnecessary unlikely to the first embodiment and an expensive device is not unnecessary unlikely to the second embodiment, so that the present invention can be simply introduced at low cost.

Fourth Embodiment

A fourth embodiment is an exemplary modification of the first embodiment and is different from the first embodiment in a place at which a beam is deflected to control a position at which a probe current is acquired. Similarly to the first embodiment, an electrostatic deflection electrode is used in two stages, and a place at which the deflection is performed is located in the stage subsequent to the accelerating electrode.

Figure 11:
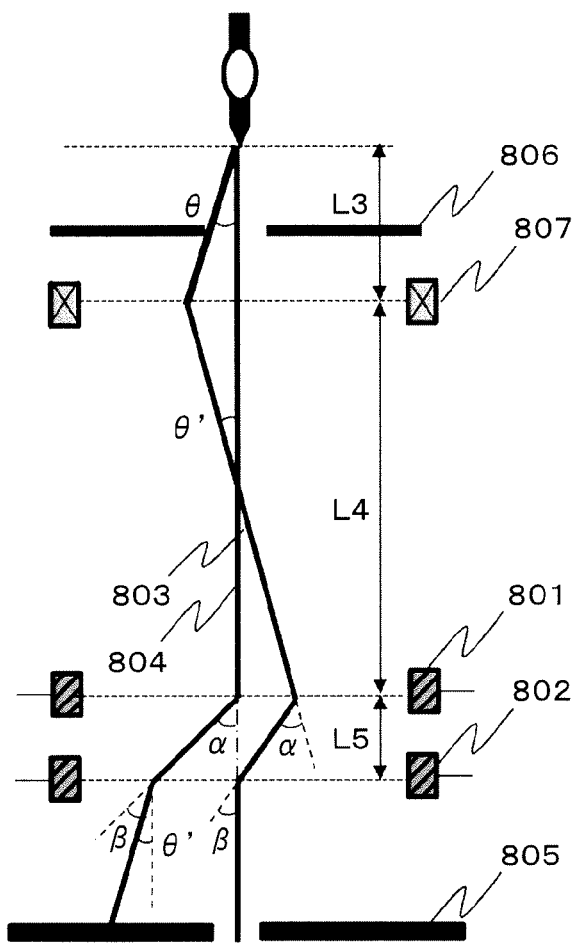
FIG. 11 is a schematic diagram of the relationship between deflection electrodes and the deflection of a beam according to a fourth embodiment.

FIG. 11 is a schematic diagram of a configuration according to the fourth embodiment. A dark ring was avoided by tilting the electrostatic deflection electrodes in two stages in the stage previous to a diaphragm 805 that finally acquires a probe current after converged on a condenser lens 806 like the first embodiment. A distance from an electron source to a condenser lens 807 is defined as L3, a distance from the lens 807 to an electrode 801 is defined as L4, a distance from the electrode 801 to the electrode 802 is defined as L5, and a beam emitted from the electron source in the θ-direction is supposed to be converged in a θ'-direction in the lens 807.

As illustrated in FIG. 11, a beam 803 emitted from the electron source to the θ-direction was passed through the diaphragm 805 by deflecting the beam at the angle α by the electrode 801 and at the angle β in the electrode 802. That is, voltages applied to the first deflection electrode and the second deflection electrode were controlled by preparing a table expressing the relationship among the angles θ, θ', α, and β so as to satisfy:

$L3 \tan θ - L4 \tan θ' + L5 \tan α = 0$ $θ' = α - β$.

It is noted that for a method for acquiring the distribution of electric current strength, any one method described in the first, second, and third embodiments may be used.

The effect according to the present invention is the same as the first embodiment. However, the embodiment is advantageous in that the stage previous to a typical accelerating electrode is spatially narrow and it is not easy to insert a large-sized electrode or coil, so that an electrode or coil for deflection can be disposed in the stage subsequent to the accelerating electrode with more space, and the degree of freedom for design can be enhanced.

Fifth Embodiment

Figure 12:
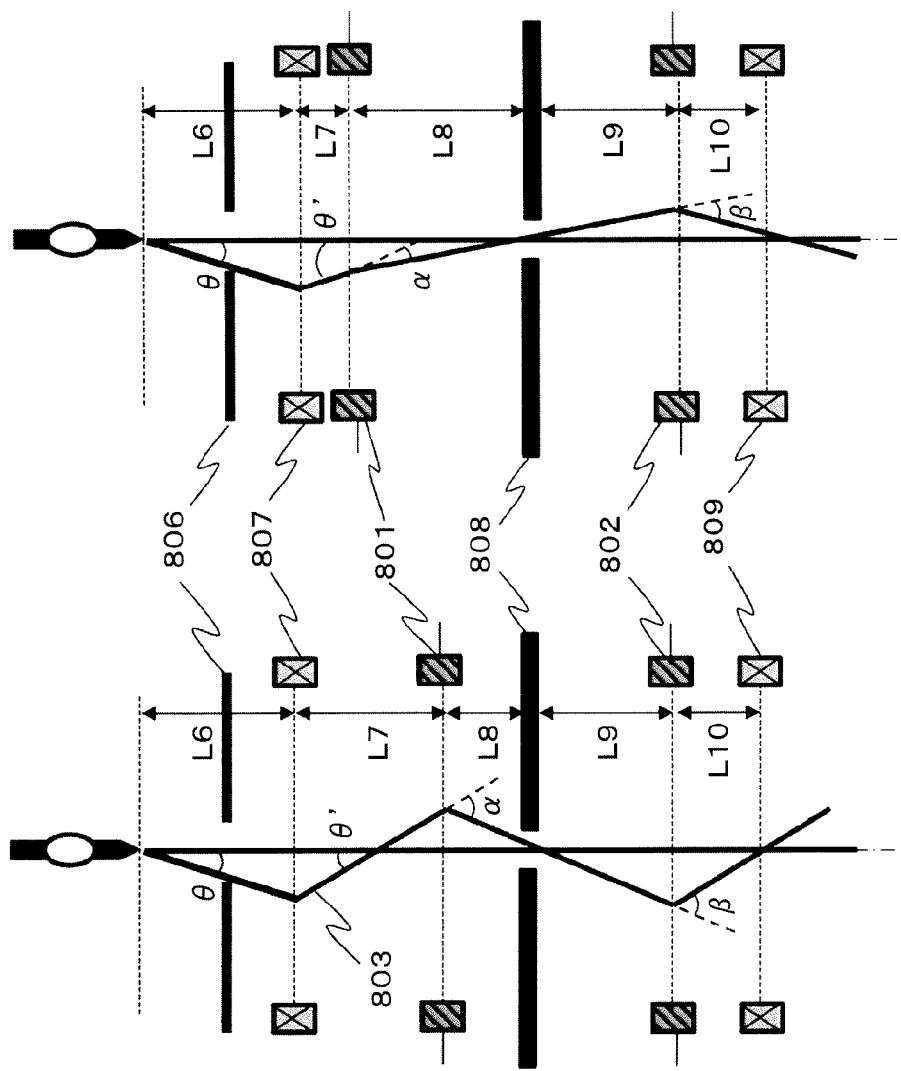
FIG. 12 is a schematic diagram of the relationship between deflection electrodes and the deflection of a beam according to a fifth embodiment.

This embodiment is an embodiment in which deflection is performed in the stage subsequent to the accelerating electrode, similarly to the fourth embodiment, and deflection in the second stage is performed in the stage subsequent to a diaphragm 808. A dark ring was avoided by deflecting an electron beam 803 emitted from an electron source at an angle using an electrode 801, and the beam was deflected so as to pass through the center of the main plane of an objective lens 809 that converges the electron beam on a sample using an electrode 802. FIG. 12 is a schematic diagram. Two pairs of electrostatic deflection electrodes were used also in the embodiment. The embodiment includes a method for deflecting a beam at the electrode 801 before converging the beam at a condenser lens 807, and a method for deflecting a beam at the electrode 801 after temporarily converging the beam at the lens 807.

First, the case of the former will be described with reference to the configuration on the left side of FIG. 12. The beam 803 emitted from the electron source in the θ-direction is converged in the θ'-direction at the lens 807. Generally, the beam is blocked by the diaphragm 808 and is not applied to the sample. However, the electrode 801 was disposed here to deflect the beam at the angle α, and the beam was passed through the diaphragm. Subsequently, the beam was deflected at the angle β using the electrode 802, and was passed through the center of the main plane of the objective lens 809. In the embodiment, attention was paid so as not to displace a point on which the beam was converged, that is, so as not to displace a point on the sample from the optical axis. At this time, when a distance from the electron source to the lens 807 is defined as L6, a distance from the lens 807 to the electrode 801 is defined as L7, a distance from the electrode 801 to the diaphragm 808 is defined as L8, the distance to the electrode 802 is defined as L9, and a distance from the electrode 802 to the objective lens 809 is defined as L10, it is fine to control voltages applied to the electrodes 801 and 802 by preparing a table of the angles α and β so as to satisfy:

$$L6 \tan \theta - L7 \tan \theta' + (L8+L9)\tan(\alpha-\theta') - L10 \tan(\beta-\alpha+\theta')=0$$

$$L6 \tan \theta - L7 \tan \theta' + L8(\alpha-\theta')=0.$$

Subsequently, the latter will be described with reference to the configuration on the right side of FIG. 12. It is not different in that a beam is deflected so as to pass through the diaphragm by the electrode 801 and the beam is deflected so as to pass through the center of the objective lens by the electrode 802. At this time, it is fine to control voltages applied to the electrodes 801 and 802 by preparing a table of the angles α and β so as to satisfy:

$$L6 \tan \theta - L7 \tan \theta' - (L8+L9)\tan(\theta'-\alpha) + L10 \tan(\beta+\alpha-\theta')=0$$

$$L6 \tan \theta - L7 \tan \theta' - L8(\theta'-\alpha)=0.$$

It is noted that also in this case, attention was paid so as not to displace a point on the sample from the optical axis. It is noted that in the embodiment, for a method for acquiring the distribution of electric current strength, any one method described in the first, second, and third embodiments may be used.

The effect according to the embodiment is the same as the first embodiment and the fourth embodiment. However, the embodiment is advantageous in that the deflection electrode in the second stage can be disposed in the stage subsequent to the diaphragm, so that the degree of freedom for design is enhanced more than in the first and fourth embodiments.

It is noted that it is also possible that the foregoing first, second, and third embodiments are performed, the distribution of the amount of the electric current of the electron beam is acquired, and it is determined whether the optimum place in the electron beam emitted from the electron source is used, that is, the center of the beam is used. The electron beam is emitted from the electron source with a spread at an angle of about 10 degrees. Here, since the electric current value and ΔE are changed according to an angle displaced from the center of the beam, the two-dimensional detection mechanism, which is a part of the present invention, is used, so that it can be determined whether a probe beam is acquired from the center of the beam. Similarly in the case where a dark ring is detected based on these detected results, the probe beam can be acquired from the center of the beam. Thus, it is possible to reduce the variation of the inspection performance for individual apparatuses caused by the slope of the beam.

Moreover, it is also possible to provide a way in which the first, second, and third embodiments are used to acquire the distribution of the electric current of the electron beam for detecting an error in the electron source. The diameter of the tip end of the electron source is very small as a diameter of 0.3 to 2 μm, the shape of the tip end is changed caused by discharges between the electrodes and the electron source or an abrupt change in heating temperature, and emission becomes abnormal. When this error is taken place, the strength of the electric field produced at the tip end of the electron source is changed to vary ΔE and the amount of current of the electron beam emitted, even though a voltage applied to the electron source is the same. Generally, the diameter of the tip end of the electron source is increased, the strength of the electric field is reduced, and the amount of the electric current of the electron beam is reduced. However, even though the tip end of the electron source is increased, a pointed place is sometimes locally generated. In this case, the electric field is locally concentrated, and a region with a high current density is locally formed in the emitted beam. When a probe current is acquired from this region, a sufficiently great probe current can be obtained, which is considered to be an electron source with no errors only by detecting a probe current conventionally. In the case where this error is taken place, the electric field is locally concentrated to cause an uneven strength distribution. Because of this, the beam intensity distribution is acquired according to the present invention, so that it is possible to detect an error at the tip end of the electron source. In the case where this error is taken place, there is only a method for replacing the electron source, so that an early determination whether to replace the electron source can be conducted according to the present invention.

The present invention is not limited to the foregoing embodiments, and includes various exemplary modifications. For example, the forging embodiments are described in detail for easily understanding the present invention. The present invention is not always limited to ones including all the described configurations. Moreover, all the configuration or a part of the configuration of a certain embodiment of the electron beam apparatus such as an electron microscope can be replaced by all the configuration or a part of the configuration according to an embodiment using the other charged particle beams such as an ion beam, and the configuration of a certain embodiment can be added with the configuration according to the configuration of another embodiment. Moreover, a part of the configurations of the embodiments can be added with, removed from, or replaced by the other configurations.

Furthermore, the configurations, the functionalities, the processing units, or the like of the forgoing prediction-determination system are described as an example is taken in which a program is created to implement a part or all the configurations, the functionalities, the processing units, or the like. However, it is without saying that a part or all of them can be implemented by hardware as by designing a part or all of them using an integrated circuit, for example.

The invention claimed is:

1. A charged particle beam apparatus comprising:
   a distribution detecting unit configured to measure a distribution of an amount of an electric current with respect to an emitting direction of a charged particle beam emitted from a charged particle beam emitter;
   a fluctuation predicting unit configured to predict a fluctuation of an electric current applied to a sample from a distribution of an electric current of the charged particle beam measured by the distribution detecting unit;
   a position determining unit configured to determine a position of the electric current applied to the sample based on a predicted result of the fluctuation predicting unit; and
   a position control unit configured to control a position at which the charged particle beam applied to the sample is acquired based on a determination made by the position determining unit.

2. The charged particle beam apparatus according to claim 1,
   wherein: the fluctuation predicting unit predicts a position of a dark ring appearing in the distribution of the amount of the electric current; and
   the position control unit acquires the charged particle beam as avoiding a predicted position of the dark ring.

3. The charged particle beam apparatus according to claim 1,
   wherein the distribution detecting unit is configured of a two-dimensional charged particle beam detector configured to detect a charged particle beam applied to the sample.

4. The charged particle beam apparatus according to claim 1, further comprising a diaphragm configured to adjust an amount of an electric current by blocking the charged particle beam applied to the sample on an optical axis, wherein the distribution detecting unit is configured of a two-dimensional charged particle beam detector disposed on a surface of the diaphragm.

5. The charged particle beam apparatus according to claim 1, further comprising a deflector configured to deflect a charged particle beam emitted from the charged particle beam emitter, wherein the deflector is configured of one of an electrode and a coil, the electrode deflecting the charged particle beam using an electric field, the coil deflecting the charged particle beam using a magnetic field.

6. The charged particle beam apparatus according to claim 5, wherein the deflector performs deflection in multiple stages using two or more of electrodes or two or more of coils.

7. The charged particle beam apparatus according to claim 6, further comprising a converging coil that converges the charged particle beam, wherein two or more of electrodes or two or more of coils configuring the deflector are disposed in a stage previous to the converging coil.

8. The charged particle beam apparatus according to claim 6, further comprising a converging coil that converges the charged particle beam, wherein two or more of electrodes or two or more of coils configuring the deflector are disposed in a stage previous to and a stage subsequent to the converging coil.

9. The charged particle beam apparatus according to claim 6, further comprising a converging coil that converges the charged particle beam, wherein two or more of electrodes or two or more of coils configuring the deflector are disposed in a stage subsequent to the converging coil.

10. The charged particle beam apparatus according to claim 1, further comprising an objective lens disposed on the charged particle beam emitter side of the sample, wherein the distribution detecting unit is disposed below the charged particle beam emitter and above the objective lens.

11. The charged particle beam apparatus according to claim 1, further comprising a display unit, wherein a distribution of an electric current of the charged particle beam detected by the distribution detecting unit is displayed on the display unit.

12. The charged particle beam apparatus according to claim 11, wherein a dark ring detected by the distribution detecting unit is displayed on the display unit.

13. The charged particle beam apparatus according to claim 12, wherein a predicted position, a diameter, and a velocity of the dark ring predicted by the fluctuation predicting unit are displayed on the display unit.

14. The charged particle beam apparatus according to claim 12, wherein a moving direction and traveling time of the dark ring predicted by the fluctuation predicting unit are displayed on the display unit.

15. The charged particle beam apparatus according to claim 11, wherein an optimum position at which the charged particle beam is acquired, the position being determined by the position determining unit, is displayed on the display unit.

* * * * *